United States Patent

Nakayama et al.

Patent Number: 5,112,458
Date of Patent: May 12, 1992

[54] PROCESS FOR PRODUCING DIAMOND-LIKE FILMS AND APPARATUS THEREFOR

[75] Inventors: Masatoshi Nakayama; Kunihiro Ueda, both of Saku, Japan

[73] Assignee: TDK Corporation, Tokyo, Japan

[21] Appl. No.: 457,511

[22] Filed: Dec. 27, 1989

[51] Int. Cl.⁵ .............................. C01B 31/00
[52] U.S. Cl. ...................... 204/173; 427/38
[58] Field of Search .......... 204/173; 427/38; 423/446

[56] References Cited

U.S. PATENT DOCUMENTS

| | | | |
|---|---|---|---|
| 4,401,054 | 8/1983 | Matsuo et al. | 118/723 |
| 4,767,608 | 8/1988 | Matsumoto et al. | 204/173 |
| 4,913,929 | 4/1990 | Moslehi et al. | 118/715 |
| 4,940,015 | 7/1990 | Kobashi et al. | 118/723 |

FOREIGN PATENT DOCUMENTS 59-174507  3/1984  Japan .
59-174508  3/1984  Japan .

*Primary Examiner*—John F. Niebling
*Assistant Examiner*—Steven P. Marquis
*Attorney, Agent, or Firm*—Fish & Richardson

[57] ABSTRACT

In a process for producing a diamond-like film which comprises introducing a hydrocarbon feed gas or a feed gas capable of producing a hydrocarbon on decomposition or reaction into a vacuum, ionizing the gas, and depositing the same on a substrate to form a diamond-like film thereon, the hydrocarbon gas is passed through a plasma exciter prior to the introduction into the vacuum. An apparatus for practicing the process comprises a plasma exciter means located on a passage through which the hydrocarbon gas is introduced into the vacuum.

9 Claims, 2 Drawing Sheets

PROCESS FOR PRODUCING DIAMOND-LIKE FILMS AND APPARATUS THEREFOR

BACKGROUND OF THE INVENTION

This invention relates to a process for producing a diamond-like film and an apparatus therefor, and more specifically to a process and an apparatus for producing a diamond-like film with a high degree of film-forming efficiency. The term "diamond-like film" used herein means to include a diamond or diamond-like film which is at least very close in crystal structure to genuine diamond. The degree of crystalization depends on the process conditions.

Many different processes have hitherto been proposed for the manufacture of diamond or diamond-like carbon films. However, difficulties have been involved in forming films of adequately high crystallinity, close to that of natural diamond crystals. The prior art processes include one (called ionization evaporation) which consists of ionizing a lower hydrocarbon gas such as methane gas by arc discharge or other ionizing means to form an ion stream and then accelerating the flow by the application of an electric field and directing it toward a substrate on which to form an objective film. The process is known for high film-forming efficiency and for the excellence of the resulting diamond-like film, with such good surface properties, high hardness, great heat conductivity, and high refractive index that no surface finish treatment is necessary.

The weak point of the conventional processes that depend on ionization, such as ionization evaporation, for the formation of a diamond-like film is slowness, the film-forming rate being usually of the order of 5μm per hour. Improvements in this respect are essential for the commerical acceptance of these processes. Further, it would be desirable if the efficiency of electric power consumption per unit thickness of the film were enhanced and the film-forming rate increased without any change in the properties of the diamond-like film.

SUMMARY OF THE INVENTION

Therefore, the present invention has for its object to improve the film-forming rate in a process for producing a diamond-like film which comprises introducing a hydrocarbon feed into a vacuum, ionizing the feed, and directing the same toward a substrate to form a diamond-like film thereon.

The above object is realized in accordance with the invention by a process and an apparatus for producing a diamond-like film by introducing a hydrocarbon feed gas or a feed gas capable of producing a hydrocarbon on decomposition or reaction into a vacuum, ionizing the gas, and depositing the same on a substrate to form a diamond-like film thereon, characterized in that plasma excitation is caused before the introduction of the hydrocarbon gas into the vacuum.

For the purposes of the invention, the term "hydrocarbon" is used to mean any of saturated hydrocarbons, such as methane, ethane, and propane, and unsaturated hydrocarbons, such as ethylene, propylene, and acetylene. The feed gas capable of producing a hydrocarbon on decomposition is an alcohol, such as methyl alcohol or ethyl alcohol, or a ketone, such as acetone or methyl ethyl ketone, or the like. The feed gas capable of producing a hydrocarbon gas on reaction is a mixed gas such as of carbon monoxide, carbon dioxide, and hydrogen or the like. The feed gas may contain at least one member of the family consisting of such rare gases as helium, neon, and argon, or hydrogen, oxygen, nitrogen, water, carbon monoxide, carbon dioxide, and the like.

The present invention makes it possible to attain a substantial improvement in film-forming rate upon conventional ionization evaporation techniques.

Because of the principle involved, the invention is as effectively applicable to other processes that rely on ionization, including hot-filament and electron-assisted CVD techniques besides other ionization evaporation processes.

DETAILED DESCRIPTION

Ionization evaporation, which forms the technical basis of the present invention, is disclosed in the publications of Japanese Patent Application Public Disclosure (Kokai) Nos. 174507/1984 and 174508/1984 and elsewhere. In the working example of the invention, therefore, the procedure and apparatus based on the equipment described in those prior publications were used. Any other ionization evaporation concept may be adopted instead provided that it permits the ionization and acceleration of a hydrocarbon feed gas or a feed gas capable of producing a hydrocarbon on decomposition or reaction. For example, the processes that depend upon glow discharge, microwave, DC discharge, thermal decomposition, shock wave, or other means for the ionization of the hydrocarbon are also acceptable.

In practicing the invention, the process and apparatus described in the cited patent publications may be directly adopted. Where the apparatus is used, thermionic emission by the hot filament decomposes the hydrocarbon feed gas or a feed gas capable of producing a hydrocarbon on decomposition or reaction, affording a gas which contains numerous ionic species, neutral molecules left undecomposed, atoms, radicals, and the like. For instance, in the case of commonly used methane feed gas, the ions that result from the thermionic emission by the hot filament are mostly $CH_4^+$ and $CH_3^{30}$, the remainder consisting of small percentages of $CH_2^+$, $CH^+$, $CH^+$, $C^+$, and $H_2^+$. In addition, the gas contains various forms of nonionized reaction species, i.e. radicals, anions, carbides, unreacted matter, and the like. Collision of all these particles with the substrate results in decomposition of the ions, leaving only carbon behind, and the latter grows into a desired diamond structure. This film-forming process yields a diamond-like film with a high degree of surface smoothness.

An essential feature of the present invention is the use of a means for plasma excitation of a hydrocarbon feed gas or a feed gas capable of producing a hydrocarbon on decomposition or reaction, before its introduction into a film-forming vessel. The plasma excitation is carried out by admitting the hydrocarbon gas into a plasma-exciting chamber and applying a predetermined amount of energy to the gas. As for the means for plasma excitation, any desired one known in the art, e.g.

RF power or microwave, may be utilized. The plasma gas is formed not only from methane gas but also from any of other low-molecular-weight hydrocarbons or from a mixture of any such hydrocarbon and oxygen, nitrogen, argon, neon, helium or the like.

The prior plasma excitation of the hydrocarbon material facilitates the ionization and markedly enhances the film-forming efficiency.

Figure 1:
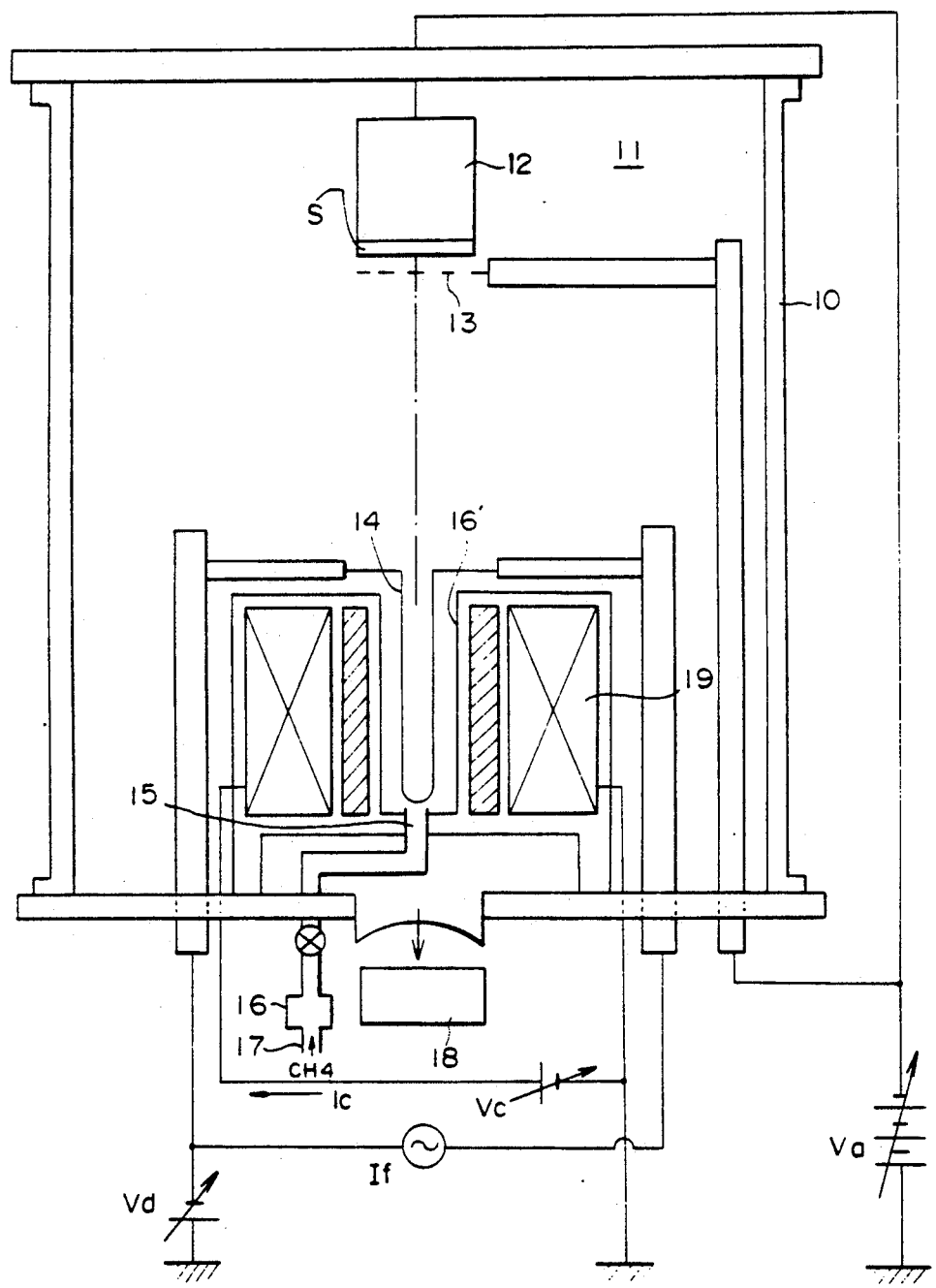
FIG. 1 is a schematic view in section of a diamond-like film-forming apparataus embodying the present invention.

Referring now to FIG. 1, the numeral 10 designates a vacuum vessel and 11 a chamber connected to an evacuation system 18 so that it can be evacuated to a high vacuum of about $10^{-6}$ torr. A substrate holder 12 holds a substrate S, toward which a grid 13 for a voltage Va accelerates the flow of ions. A filament 14 is heated by an AC source for thermionic emission and is kept at a negative potential. The numeral 15 indicates an inlet for feedding hydrocarbon gas as a starting material. An anode 16' is arranged around the filament 14 to provide a voltage Vd between itself and the filament. A magnetic coil 19 is disposed so as to surround the filament 14, the anode 16', and feed inlet 15 to produce a magnetic field for containment of ionized gas. It is thus possible to modify the quality of the resulting film through the adjustments of the voltages Vd and Va and of the current on the coil. Where the substrate for film formation is not located on the straight line as shown, the ion stream may be accordingly deflected by a suitable means.

As a feature that characterizes the present invention, a plasma exciter is provided on a line for feeding hydrocarbon feed gas. As better shown in FIG. 2, the plasma exciter 16 is located on the line 17 for feeding the hydrocarbon to the inlet 15 of the vacuum vessel 10 where a diamond-like film is to be formed. This exciter can be driven by various known means, a few of which will be cited below.

Figure 3:
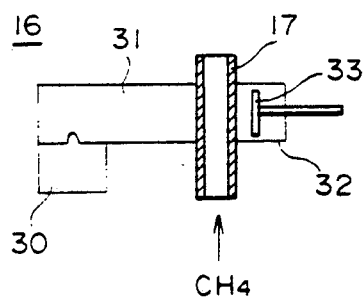
FIGS. 3 to 5 are schematic views of modified forms of the plasma exciter of the invention.

In FIG. 3 is illustrated a plasma exciter using a magnetron. An oscillator 30 generates a microwave, e.g. of 2.45 GHz, and applies it to feed gas in a waveguide 31 to induce plasma excitation. The numeral 32 designates another waveguide which is equipped with a plunger 33 adjustable for matching.

Figure 4:
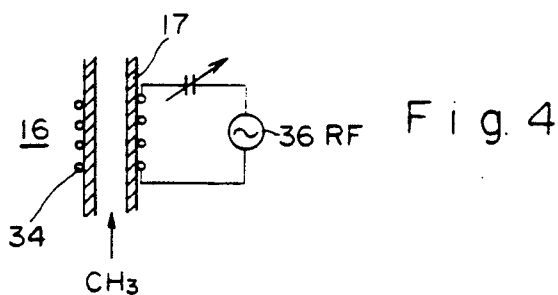

Another form of plasma exciter 16 is shown in FIG. 4. An RF coil 34 is wound round a feed pipe 17, such as of quartz glass, and an energy at a high frequency, say 13.56 MHz, from and RF power source is supplied to the coil.

Figure 5:
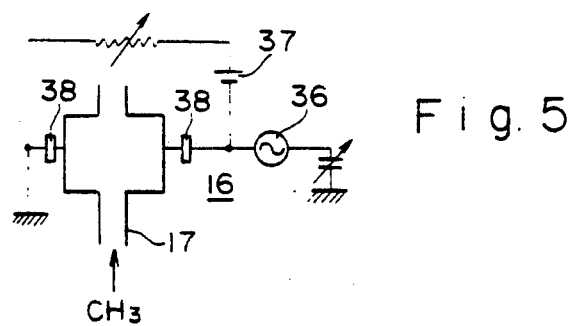

Alternatively, as depicted in FIG. 5, a pair of electrodes 38 may be added to apply both a 13.56 MHz RF power and a direct-current voltage.

Whatever other means capable of causing plasma excitation, e.g. irradiation with electron, radioactive, or ultraviolet rays, may be used as well.

The process of the invention for film forming by the use of the apparatus illustrated in FIG. 1 will now be explained in detail. First, the chamber 11 is evacuated up to a high vacuum of $10^{-6}$ torr, and while methane gas is being led into the vessel at a predetermined flow rate through the manipulation of a valve, the evacuation system 18 is controlled to establish a desired gas pressure, e.g. $10^{-1}$ torr. Meanwhile, the filament 14 is heated by the passage of an alternating current If, and a differential voltage Vd is applied between the filament 14 and the gas feed inlet 15 to cause thermionic emission by the hot filament. Methane gas or other similar hydrocarbon gas admitted to the feed pipe 17 first produces a plasma gas in the plasma exciter 16. The feed gas then enters the chamber 11 at the inlet 15 and is thermally decomposed while colliding with hot electrons from the filament to form positive ions and electrons. The latter in turn collides with other thermally decomposed particles. Repetition of this phenomenon converts the methane gas into positive ions of the thermally decomposed material.

The positive ions are directed toward the substrate S, accelerated by a negative potential Va applied to the grid 13. For the potential, current, temperature, and other conditions for the individual parts involved, refer to the above-mentioned patent publications and other known pieces of the literature.

As the plasma source, it is possible to use, besides methane gas, any of other low-molecular-weight hydrocarbon feed gases or feed gases capable of giving hydrocarbons upon decomposition or reaction, or a mixture of one of such feed gases and oxygen, nitrogen, argon, neon, helium or the like.

The invention is illustrated by the following example.

EXAMPLE

Figure 2:
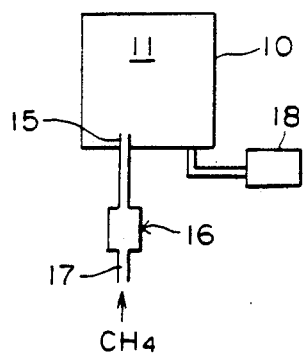
FIG. 2 is a schematic view of a plasma exciter according to the invention.

As plasma exciters, those shown in FIGS. 2 and 3 were employed. Plasma was formed in each exciter 16 by introducing methane gas at a feed rate of 30 SCCM and at a pressure of $10^{-1}$ torr. In the film-forming chamber, a silicon wafer 30 mm in diameter was used as the substrate. Following the evacuation of the vacuum vessel 10 to $10^{-6}$ torr, the methane gas was introduced up to a gas pressure of $10^{-1}$ torr, and thermionic emission by the hot filament was effected. The magnetic flux density of the magnetic coil 19 was 400 gauss. The substrate voltage was 300 V and the substrate temperature 200° C. A current of 25 A was tuned on to pass though the filament 14. A 3μm-thick film was thus formed on the substrate.

COMPARATIVE EXAMPLE

A 3μm-thick film was formed using the same apparatus and conditions as described in Example with the exception that the plasma exciter was not employed.

The rates at which diamond-like films were formed in Example and Comparative Example were determined.

The results are given in the table below.

As can be seen from the table, it has now been found that according to the present invention the usual film-forming rate is increased by at least about 9 percent, or even 17 percent or more under certain conditions. The invention also permits a substantial saving on electric power.

| Flow rate SCCM | Pressure Torr | Plasma excitation | Film-forming rate μm/h | Increment % |
|---|---|---|---|---|
| 30 | 0.1 | RF200W 13.56 MHz | 5.7 | 9.2 |
| 30 | 0.1 | None | 5.2 | 5.2 |
| 30 | 0.1 | MW200W 2.454 GHz | 6.1 | 17.3 |

What is claimed is:

1. A process for producing a diamond-like film, comprising the steps of:
   passing a hydrocarbon feed gas or a feed gas which produces a hydrocarbon on decomposition or reaction through a plasma exciter exciting said feed gas;
   introducing said hydrocarbon feed gas or a feed gas which produces a hydrocarbon on decomposition or reaction into a vacuum;
   ionizing said feed gas; and depositing said ionized feed gas on a substrate to form a diamond-like film thereon.

2. The process of claim 1 further comprising
admitting said hydrocarbon feed gas or a feed gas capable of producing a hydrocarbon upon decomposition or reaction into a plasma-exciter chamber, and
actuating plasma-exciter means to apply a predetermined amount of energy to said feed gas within said plasma-exciter chamber, prior to introduction of said feed gas into said vacuum.

3. The process of claim 2 wherein said plasma-exciter means comprises an Rf power source.

4. The process of claim 3 wherein said plasma-exciter means further comprises a direct current source.

5. The process of claim 2 wherein said plasma-exciter means comprises a microwave source.

6. The process of claim 1, wherein said ionizing step comprises contacting said feed gas which is passed through said plasma exciter with thermionic emission formed by at least one hot filament.

7. The process of claim 6, wherein said depositing step comprises accelerating said ionized feed gas with a potential onto said substrate, said substrate being remote from said filament.

8. The process of cliam 1, wherein said feed gas and said substrate are maintained at a low temperature.

9. The process of claim 8, wherein said feed gas and said substrate are maintained at approximately 200° C.

* * * * *

UNITED STATES PATENT AND TRADEMARK OFFICE
CERTIFICATE OF CORRECTION

PATENT NO. : 5,112,458
DATED : May 12, 1992
INVENTOR(S) : Masatoshi Nakayama, et al It is certified that error appears in the above-indentified patent and that said Letters Patent is hereby corrected as shown below:

Column 2, line 50, "$CH_3^{30}$," should read --$CH_3^+$,--.

Column 2, line 52, delete "$CH^+$" (second occurrence).

Column 3, line 17, "feedding" should read --feeding--.

Signed and Sealed this

Twenty-fourth Day of August, 1993

Attest:

BRUCE LEHMAN

*Attesting Officer*     *Commissioner of Patents and Trademarks*